United States Patent
Ohshima

(10) Patent No.: US 8,315,028 B2
(45) Date of Patent: Nov. 20, 2012

(54) OVERCURRENT PROTECTION APPARATUS

(75) Inventor: Shunzou Ohshima, Kosai (JP)

(73) Assignee: Yazaki Corporation, Tokyo (JP)

( * ) Notice: Subject to any disclaimer, the term of this patent is extended or adjusted under 35 U.S.C. 154(b) by 128 days.

(21) Appl. No.: 12/595,893

(22) PCT Filed: May 14, 2008

(86) PCT No.: PCT/JP2008/058818
§ 371 (c)(1),
(2), (4) Date: Oct. 14, 2009

(87) PCT Pub. No.: WO2008/140096
PCT Pub. Date: Nov. 20, 2008

(65) Prior Publication Data
US 2010/0110599 A1 May 6, 2010

(30) Foreign Application Priority Data
May 14, 2007 (JP) .................. 2007-128411

(51) Int. Cl.
*H02H 3/00* (2006.01)
*H02H 3/08* (2006.01)
*H02H 9/02* (2006.01)
*H02H 9/08* (2006.01)

(52) U.S. Cl. ........ 361/94; 361/93.1; 361/93.7; 361/93.9

(58) Field of Classification Search .................... 361/94, 361/93.1, 93.7, 93.9
See application file for complete search history.

(56) References Cited

U.S. PATENT DOCUMENTS
5,914,586 A * 6/1999 Fujita et al. .................. 320/136
7,079,368 B2 * 7/2006 Ishikawa et al. ............. 361/93.1
(Continued)

FOREIGN PATENT DOCUMENTS
CN 1511376 A 7/2004
(Continued)

OTHER PUBLICATIONS
International Search Report (PCT/ISA/210) dated Jul. 22, 2008, for PCT/JP2008/058818.
(Continued)

*Primary Examiner* — Jared Fureman
*Assistant Examiner* — Lucy Thomas
(74) *Attorney, Agent, or Firm* — Sughrue Mion, PLLC

(57) ABSTRACT

An overcurrent protection apparatus which, when a layer short or a dead short occurs in a load circuit, interrupts the circuit in accordance with respective situations, whereby the load circuit is protected is provided. The apparatus includes a first overcurrent detecting section for detecting a counter electromotive force generated in a power supply wiring, and a second overcurrent detecting section, disposed in each of the plural load circuits, for detecting that a load current ID becomes an overcurrent. The apparatus includes a delaying section for outputting a delay signal at a first delay time when an overcurrent is detected by the second overcurrent detecting section, and for outputting the delay signal at a second delay time which is shorter than the first delay time when an overcurrent is detected by both of the first overcurrent detecting section and the second overcurrent detecting section. According to the configuration, in the case of the occurrence of a layer short, the load circuit can be interrupted at the first delay time, and, in the case of the occurrence of a dead short, the load circuit can be interrupted at the second delay time.

5 Claims, 5 Drawing Sheets

U.S. PATENT DOCUMENTS

| | | | |
|---|---|---|---|
| 7,177,130 B2 * | 2/2007 | Ohshima | 361/93.9 |
| 2004/0207967 A1 | 10/2004 | Ohshima | |
| 2005/0286200 A1 | 12/2005 | Ohshima | |
| 2006/0007626 A1 | 1/2006 | Ohshima | |

FOREIGN PATENT DOCUMENTS

| | | |
|---|---|---|
| CN | 1719730 A | 1/2006 |
| JP | 2002-353794 A | 12/2002 |
| JP | 2006-005581 A | 1/2006 |
| JP | 2006-060971 A | 3/2006 |

OTHER PUBLICATIONS

Office Action dated May 24, 2011 from the State Intellectual Property Office of the People's Republic of China in counterpart application No. 200880014644.9.

* cited by examiner

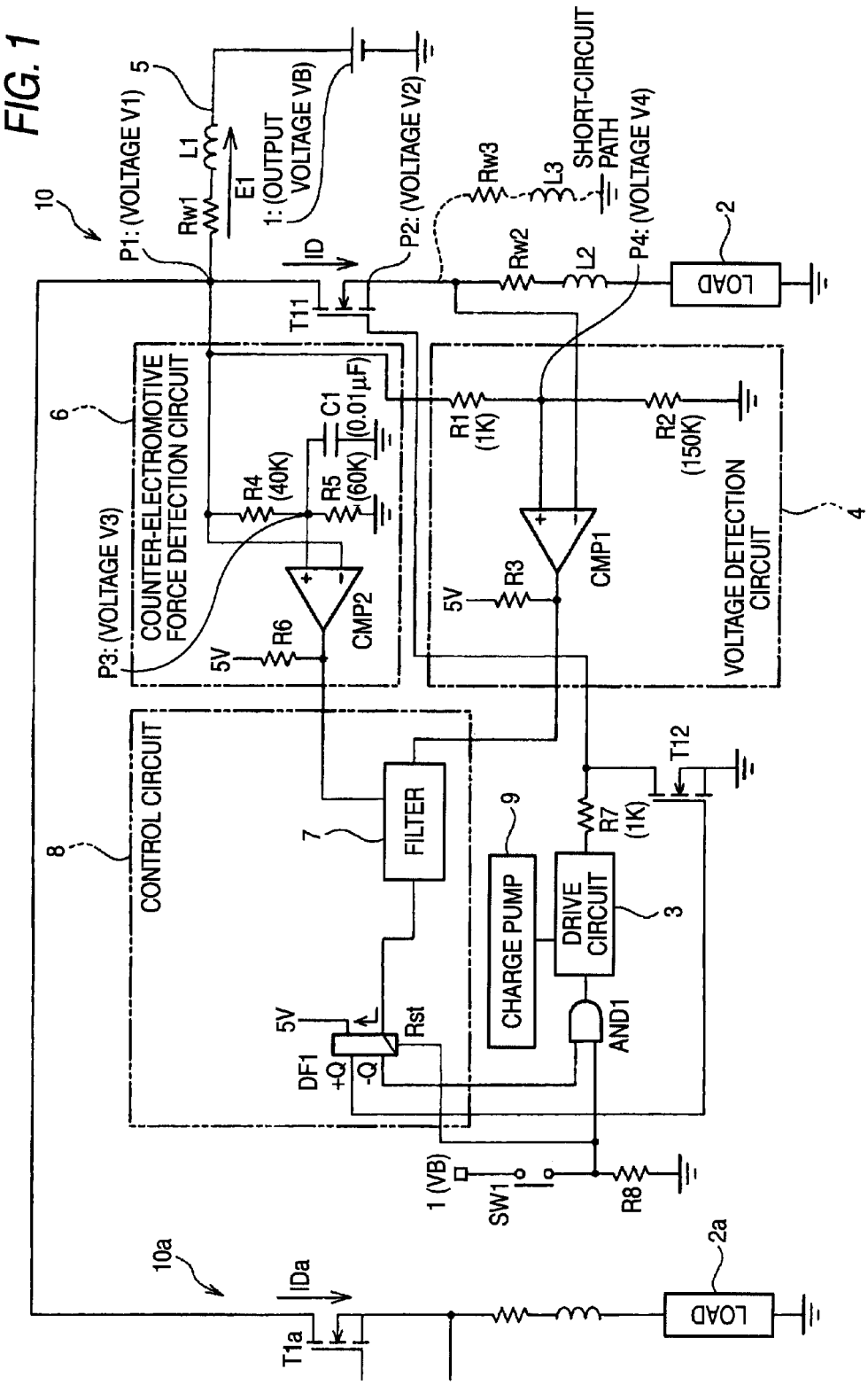

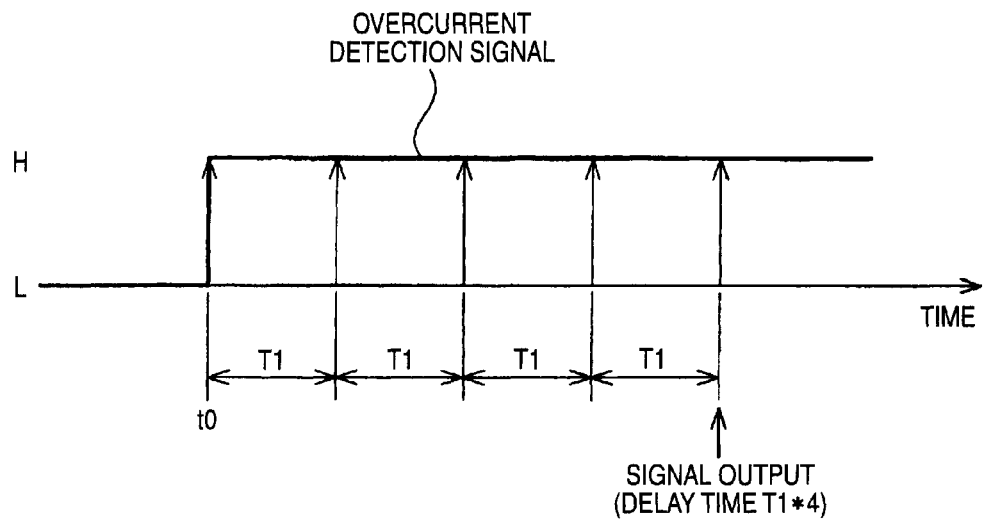
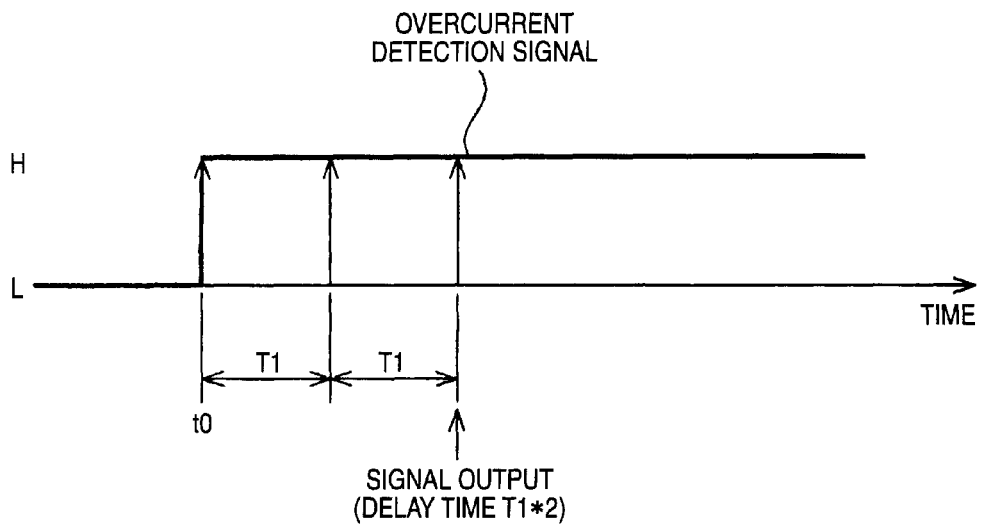

OVERCURRENT PROTECTION APPARATUS

TECHNICAL FIELD

The present invention relates to a load drive apparatus which includes load circuits of plural systems, and a DC power supply for supplying an electric power to the load circuits, and more particularly to an overcurrent protection apparatus which, when a layer short and a dead short occur in a load circuit, interrupts the load circuit in accordance with respective situations, thereby protecting the circuit.

BACKGROUND ART

Loads such as motors, lamps, and heaters mounted on a vehicle are powered by a battery mounted on the vehicle, to be driven. The loads are connected to the battery through semiconductor switches, and the semiconductor switches are turned on/off, thereby switching over drive/stop of the loads.

In a load circuit having a semiconductor switch and a load, a layer short in which an overcurrent is produced by a cause such as an overload, or a dead short in which an output terminal of the battery is directly short-circuited with the ground is sometimes produced. In order to protect the load circuit when such a trouble occurs, an overcurrent protection apparatus is mounted on a conventional load drive apparatus (for example, see Patent Reference 1).

FIG. 5 is a circuit diagram showing the configuration of a load drive apparatus on which a conventional overcurrent protection apparatus is mounted. As shown in the figure, the load drive apparatus has load circuits 100, 100a of plural systems (in the figure, two systems), and a battery 101 (an output voltage VB) is connected to the load circuits 100, 100a.

The load circuit 100 is configured by a series circuit of a semiconductor switch T101 formed by, for example, a MOS-FET, and a load 102. A drive circuit 103 is connected to the gate of the semiconductor switch T101, and the gate is grounded to the ground through a semiconductor switch T102. An AND circuit AND101, a switch SW101, and a resistor R101 are connected to the input side of the drive circuit 103.

The apparatus includes a voltage detection circuit 104 which detects the both-end voltage of the semiconductor switch T101, and which compares the both-end voltage with a predetermined reference voltage. A noise removing filter 107 is disposed on the output side of the voltage detection circuit 104. The apparatus further includes a counter-electromotive force detection circuit 106 which detects a counter electromotive force E1 appearing in a power supply line 105 connecting a point P1 (a voltage V1) to which the load circuits 100, 100a are connected, with the battery 101. The apparatus further includes an AND circuit AND102, an OR circuit OR101, and a latch DF101. The resistance of the power supply line 105 is indicated by Rw1, and the inductance by L1.

Hereinafter, the operation of the load drive circuit shown in FIG. 5 will be described. In a usual state, the semiconductor switch T101 is turned on or off by a drive signal output from the drive circuit 103, to switch over drive/stop of the load 102. In the case where the current flowing through the load 102 is caused to become an overcurrent for any reason and the current increase gradient is gentle during the overcurrent, i.e., in the case where a wiring short such as a layer short occurs, the load current ID is increased. Then, the both-end voltage of the semiconductor switch T101 is raised, and the voltage detection circuit 104 outputs an overcurrent detection signal.

The overcurrent detection signal is supplied to the latch DF101 through the OR circuit OR101 to turn on the semiconductor switch T102. Then, the semiconductor switch T101 is turned off to interrupt the load circuit 100, whereby the circuit can be protected.

By contrast, in the case where an accident such as that the wire connecting the semiconductor switch T101 with the load 102 is directly connected to the ground, i.e., a dead short occurs, an excessive current in which the current increase gradient is steep flows through the power supply line 105, and a large counter electromotive force E1 is generated in the power supply line 105. Then the generation of the counter electromotive force E1 is detected by the counter-electromotive force detection circuit 106, and a counter-electromotive force detection signal is output.

The counter-electromotive force detection signal is supplied to one input terminal of the AND circuit AND102, the overcurrent detection signal output from the voltage detection circuit 104 is supplied to the other input terminal, and hence an output signal of the AND circuit AND102 is at the H level. Therefore, an output signal of the OR circuit OR101 is at the H level, and hence the output of the latch DF101 is inverted, so that the semiconductor switch T102 is turned on, the semiconductor switch T101 is turned off, and the load circuit 100 is interrupted.

The reason why the AND circuit AND102 is disposed is that the load circuit (the load circuit 100a) other than the load circuit 100 in which the dead short occurs is not caused to be interrupted. In a configuration where the AND circuit AND102 is not disposed, when a dead short occurs in one of the plural load circuits 100, 100a, all of the load circuits connected to the battery 101 are interrupted. In order to prevent this phenomenon from occurring, the AND circuit AND102 is disposed.

However, the overcurrent protection apparatus having the above-described configuration uses the output of the logical sum (AND) of the overcurrent detection signal output from the voltage detection circuit 104, and the counter-electromotive force detection signal output from the counter-electromotive force detection circuit 106. Therefore, the operation of the latch DF101 is depend on the overcurrent detection signal output from the voltage detection circuit 104, and, when generation of a counter electromotive force is detected, the load circuit 100 cannot be instantly interrupted.

Patent Reference 1: JP-A-2006-5581

DISCLOSURE OF THE INVENTION

Problem that the Invention is to Solve

As described above, in the conventional overcurrent protection apparatus, there is a problem in that, when a dead short occurs, the load circuit 100 cannot be instantly interrupted to protect the circuit.

The invention has been conducted in order to solve the conventional problem. It is an object of the invention to provide an overcurrent protection apparatus which, when a layer short or a dead short occurs in a load circuit, interrupts the circuit in accordance with respective situations, whereby the circuit can be surely protected.

Means for Solving the Problems

In order to attain the object, an overcurrent protection apparatus of the invention, is configured so that a plurality of load circuits each configured by a series connection of a semiconductor switch and a load are connected in parallel, and an electric power is supplied to the load circuits through a common power supply wiring. The overcurrent protection apparatus comprises a first overcurrent detecting section that detects an overcurrent flowing through a power supply line on the basis of a degree of a counter electromotive force generated in the power supply wiring; a second overcurrent detecting section that is disposed in each of the load circuits and detects an overcurrent on the basis of a level of a current flowing through each of the load circuits; a delaying section that outputs a delay signal at a first delay time when the overcurrent is detected by only the second overcurrent detecting section, and outputs the delay signal at a second delay time which is shorter than the first delay time when the overcurrents are detected by both of the first overcurrent detecting section and the second overcurrent detecting section; and a controlling section that interrupts only the load circuit from which the overcurrent is detected by the second overcurrent detecting section in the plurality of load circuits.

Preferably, the second overcurrent detecting section detects a level of a voltage produced across both ends of the semiconductor switch by a current flowed through the semiconductor switch.

Preferably, the delaying section is a filter circuit which samples a signal from the second overcurrent detecting section at a predetermined sampling period to output the delay signal. When the overcurrent is not detected by the first overcurrent detecting section, the filter circuit performs the sampling at a first sampling period, and when the overcurrent is detected by the first overcurrent detecting section, the filter circuit performs the sampling at a second sampling period which is shorter than the first sampling period.

Preferably, the delaying section is a filter circuit which samples a signal from the second overcurrent detecting section at a predetermined sampling period to output the delay signal. When the overcurrent is not detected by the first overcurrent detecting section, the filter circuit sets a sampling number in outputting the delay signal, as a first sampling number, and when the overcurrent is detected by the first overcurrent detecting section, the filter circuit sets the sampling number in outputting the delay signal, as a second number which is smaller than the first sampling number.

Preferably, the delaying section includes a first delay circuit having the first delay time, and a second delay circuit having the second delay time which is shorter than the first delay time. The delaying section outputs the delay signal by using the first delay circuit when the overcurrent is detected by only the second overcurrent detecting section, and outputs the delay signal by using the second delay circuit when the overcurrents are detected by both of the first overcurrent detecting section and the second overcurrent detecting section.

Effects Of The Invention

In the invention, when the overcurrent is detected by only the second overcurrent detecting section, the delay time in the delaying section is set to the first delay time, and, when the overcurrents are detected by both of the first overcurrent detecting section and the second overcurrent detecting section, the delay time in the delaying section is set to the second delay time. In the case where a small overcurrent is produced, therefore, the load circuit is interrupted at the first delay time, and hence it is possible to prevent the load circuit from being erroneously interrupted by an influence of noises or the like. In the case where a dead short in which a power supply is directly short-circuited with the ground occurs, the load circuit is interrupted at the second delay time, and hence it is possible to interrupt the load circuit with rapid response and protect the semiconductor switch and the other circuit components from the overcurrent. Furthermore, only the load circuit in which the dead short occurs can be interrupted, and drives of the other load circuits in which a dead short does not occur can be continued.

Preferably, a filter circuit is used as the delaying section, and the sampling period of the filter circuit is changed, whereby the first delay time and the second delay time are set. Therefore, the delay times can be set by the very simple method.

Preferably, a filter circuit is used as the delaying section, and the sampling number of the filter circuit is changed, whereby the first delay time and the second delay time are set. Therefore, the delay times can be set by the very simple method.

Preferably, two delay circuits having different delay times are disposed, when an overcurrent is detected by the second overcurrent detecting section, the delay signal is output by using the first delay circuit having the first delay time, and, when an overcurrent is detected by both of the first overcurrent detecting section and the second overcurrent detecting section, the delay signal is output by using the second delay circuit having the second delay time which is shorter than the first delay time. In the case where a small overcurrent is produced, therefore, the load circuit is interrupted at the first delay time, and hence it is possible to prevent the load circuit from being erroneously interrupted by an influence of noises or the like, and, in the case where a dead short occurs, the load circuit can be interrupted at the second delay time. Therefore, the load circuit can be interrupted with rapid response, and it is possible to protect the semiconductor switch and the other circuit components from the overcurrent. Furthermore, only the load circuit in which the dead short occurs can be interrupted, and drives of the other load circuits in which a dead short does not occur can be continued.

BRIEF DESCRIPTION OF THE DRAWINGS

FIG. 1 indicates a circuit diagram showing the configuration of a load drive apparatus on which an overcurrent protection apparatus according to an embodiment of the invention is mounted.

FIG. 2A shows a first sampling period, and FIG. 2B shows a second sampling period.

FIGS. 3A and 3B indicate timing charts showing sampling numbers of a filter circuit, FIG. 3A shows a case where the sampling number is set to five, and FIG. 3B shows a case where the sampling number is set to three.

Figure 2A:
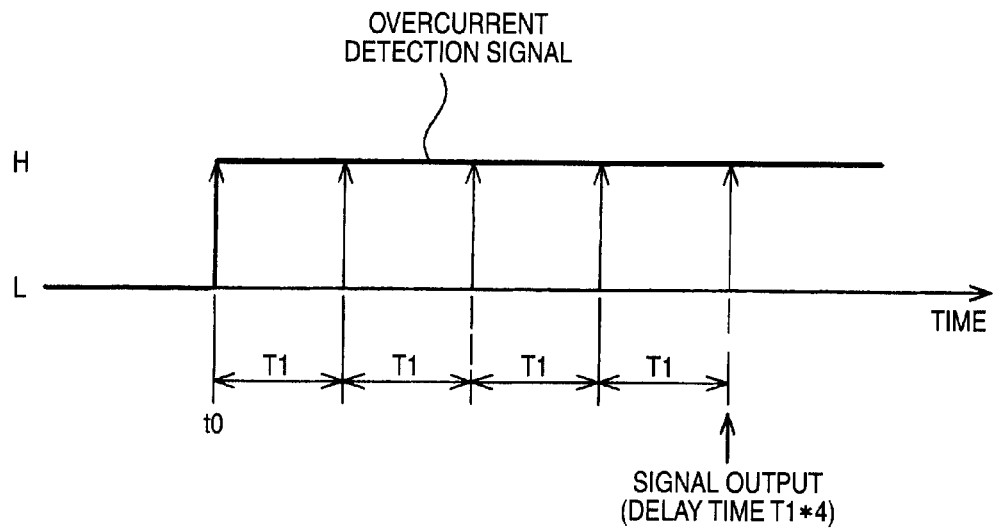
FIGS. 2A and 2B indicate timing charts showing sampling periods of a filter circuit.

DESCRIPTION OF REFERENCE NUMERALS AND SIGNS 1 battery
2 load
3 drive circuit
4 voltage detection circuit
5 power supply line
6 counter-electromotive force detection circuit
7 filter
8 control circuit
9 charge pump
10 load circuit 100 load circuit
101 battery
102 load
103 drive circuit
104 voltage detection circuit
105 power supply line
106 counter-electromotive force detection circuit
107 filter

BEST MODE FOR CARRYING OUT THE INVENTION

Hereinafter, embodiments of the invention will be described with reference to the drawings. FIG. 1 is a circuit diagram showing the configuration of a load drive apparatus on which an overcurrent protection apparatus of an embodiment of the invention is mounted. As shown in the figure, the load drive apparatus includes load circuits 10, 10a of plural systems (in the figure, two systems), and a battery 1 (an output voltage VB) which supplies an electric power for driving to the load circuits 10, 10a.

The load circuit 10 includes a series circuit of a semiconductor switch T11 configured by, for example, a MOS-FET, and a load 2 such as a lamp, a motor, and a heater, and further includes a drive circuit 3 which outputs a drive signal to the semiconductor switch T11.

The load circuit 10 further includes: a voltage detection circuit (a second overcurrent detecting section) 4 which detects the both-end voltage VDS appearing across the both ends (between the drain and the source) of the semiconductor switch T11, thereby detecting that the load current ID flowing through the semiconductor switch T11 becomes an overcurrent; and a counter-electromotive force detection circuit (a first overcurrent detecting section) 6 which is connected to a connection point P1 (a voltage V1) of the load circuits 10, 10a and the battery 1, and which detects a counter electromotive force E1 appearing in a power supply line 5 connecting the load circuits 10, 10a and the battery 1.

In a rear stage of the counter-electromotive force detection circuit 6 and the voltage detection circuit 4, a control circuit 8 for, based on output signals of the circuits 6, 4, determining whether the semiconductor switch T11 is to be turned off or not is disposed.

The load circuit 10a has a similar configuration as the load circuit 10 which is described above, and therefore the description of the configuration of the load circuit is omitted. However, the counter-electromotive force detection circuit 6 is placed in common with the load circuits 10, 10a. Namely, an output signal of a comparator CMP2 of the counter-electromotive force detection circuit 6 is connected also to a control circuit of the load circuit 10a.

Since resistance and inductance components exist between the semiconductor switch T11 and the load 2, a resistance Rw2 and an inductance L2 are equivalently shown. When a dead short in which a wiring between the semiconductor switch T11 and the load 2 is connected to the ground occurs, resistance and inductance components exist in the short-circuit path, and therefore a resistance Rw3 and an inductance L3 are equivalently shown.

The voltage detection circuit 4 includes a comparator CMP1, and resistors R1, R2, R3. A series connection of the resistors R1, R2 is arranged between the point P1 and the ground. The negative input terminal of the comparator CMP1 is connected to a point P2 (a voltage V2) which is the source of the semiconductor switch T11. The positive input terminal of the comparator CMP1 is connected to a connection point P4 (a voltage V4) of the resistors R1, R2. The output terminal of the comparator CMP1 is connected to the control circuit 8, and also to a power supply of 5 V through the resistor R3.

The resistor R1 has a resistance of, for example, 1[kΩ], and the resistor R2 has a resistance of, for example, 150[kΩ], so that the voltage V4 (the reference voltage) of the connection point P4 of the resistors is set to a voltage which is slightly lower than the voltage V2 of the point P2, or namely (V1-V4)> (V1-V2) is set. In a usual operation, therefore, the voltage V2 which is supplied to the negative input terminal of the comparator CMP1 is higher than the voltage V4 which is supplied to the positive input terminal, and hence the output signal of the comparator CMP1 is a signal of the L level. When the load current ID of the load circuit 10 is increased, the both-end voltage of the semiconductor switch T11 is raised, and hence (V1-V2)>(V1-V4) is obtained. In other words, the voltage V2 is lower than the reference voltage V4, and the output signal of the comparator CMP1 is inverted.

The counter-electromotive force detection circuit 6 includes the comparator CMP2, resistors R4, R5, R6, and a capacitor C1. A series connection of the resistors R4, R5 is placed between the point P1 and the ground. The negative input terminal of the comparator CMP2 is connected to the point P1, and the positive input terminal is connected to a connection point P3 (a voltage V3) of the resistors R4, R5. The point P3 is grounded to the ground through the capacitor C1. The resistor R4 has a resistance of, for example, 40[kΩ], and the resistor R5 has a resistance of, for example, 60 [KΩ].

The control circuit 8 has a filter circuit (delaying means) 7, and a latch DF1. The filter circuit 7 employs a digital filter, samples an overcurrent detection signal output from the voltage detection circuit 4, at a set sampling period (for example, 1 [μsec]), and, when a signal of the H level is successively detected a predetermined number of times (for example, five times), outputs a filter output signal of the H level. The filter output signal (the delay signal) is output to the latch DF1.

When the counter-electromotive force detection circuit 6 outputs a counter-electromotive force detection signal, the filter circuit 7 changes the sampling period, and then performs the sampling process. For example, the sampling period is changed to 0.25 [μsec]. Furthermore, the filter circuit 7 samples an input of the overcurrent detection signal with a plurality of times at the set sampling period, and then outputs the sampled signal, so that a delay is produced between the input and the output. Namely, the filter circuit 7 has a function of delaying means. The above-described change of the sampling period can be easily performed by, for example, adjusting a clock pulse signal.

Furthermore, the filter output signal can be output while changing the sampling number. For example, the output may be set so that, when a signal of the H level is successively detected five times as described above, the filter output signal of the H level is output, or, when a signal of the H level is successively detected three times, the filter output signal of the H level is output.

In a usual state, the output +Q of the latch DF1 is at the L level, and the output −Q is at the H level. When the H level signal is supplied from the filter circuit 7, the outputs +Q, −Q are inverted, or namely the output +Q is at the H level, and the output −Q is at the L level.

The output +Q of the latch DF1 is connected to the gate of a semiconductor switch T12 configured by a MOS-FET or the like. The semiconductor switch T12 is disposed between the gate of the semiconductor switch T11 and the ground. When the semiconductor switch T12 is turned on, therefore, the gate of the semiconductor switch T11 is grounded to the ground, and hence the semiconductor switch T11 is turned off.

The output −Q of the latch DF1 is connected to one input terminal of an AND circuit AND1, and the other input terminal is connected to the power supply through a switch SW1, and grounded to the ground through a resistor R8. The output terminal of the AND circuit AND1 is connected to the drive circuit 3. The drive circuit 3 is supplied with an electric power from a charge pump 9 to be driven. The output terminal of the drive circuit 3 is connected to the drain of the semiconductor switch T12 through a resistor R7, and also to the gate of the semiconductor switch T11.

Next, the operation of the thus configured load drive apparatus will be described. When the operator turns on the switch SW1, both the two input terminals of the AND circuit AND1 become the H level, and hence the output signal of the AND circuit AND1 becomes the H level.

The drive circuit 3 outputs the drive signal to the gate of the semiconductor switch T11. Therefore, the semiconductor switch T11 is turned on, the load current ID flows, and the load 2 is driven. When the load 2 is a lamp, for example, the lamp is lit, and, when the load 2 is a motor, the motor starts to rotate.

At this time, in the voltage detection circuit 4, the voltage (V1-V4) is higher than the voltage (V1-V2), or in other words V2>V4, and therefore the output signal of the comparator CMP1 is at the L level. Therefore, the overcurrent detection signal is not supplied to the filter circuit 7. In the counter-electromotive force detection circuit 6, V1>V3 is realized, and hence the output signal of the comparator CMP2 is at the L level.

In the case where the load 2 is driven, when the load current ID is increased (a layer short occurs), the both-end voltage (the drain-source voltage) of the semiconductor switch T11 is raised, and V1-V2 is increased. Namely, the voltage V2 of the point P2 becomes lower than the voltage V4 of the point P4, and hence the output signal of the comparator CMP1 is inverted from "L" to "H". As a result, the overcurrent detection signal is output from the comparator CMP1, and then supplied to the filter circuit 7.

The filter circuit 7 samples the supplied overcurrent detection signal at a first sampling period which is previously set, and outputs an H-level output signal which is obtained after the sampling, to the latch DF1 as the filter output signal (the delay signal).

When supplied with the filter output signal, the latch DF1 inverts the outputs +Q, −Q. Therefore, a signal of the L level is input to the one input terminal of the AND circuit AND1, and hence the output signal of the AND circuit AND1 becomes the L level, so that the output of the drive circuit 3 is at the L level. Moreover, the semiconductor switch T12 is turned on, and the gate of the semiconductor switch T11 is grounded to the ground. Therefore, the semiconductor switch T11 is turned off, and the load circuit 10 is interrupted.

As described above, in the case where a layer short occurs in the load circuit 10, the load circuit 10 is interrupted while being delayed by the delay time which is determined by the first sampling period of the filter circuit 7.

On the other hand, in the case where a dead short occurs because of a cause such as that the wire connecting the semiconductor switch T11 with the load 2 is directly connected to the ground, the overcurrent detection signal is output from the comparator CMP1 of the voltage detection circuit 4, in the same procedure as described above.

When a dead short occurs, moreover, the counter electromotive force E1 is generated by the resistance Rw1 and inductance L1 of the power supply line 5. Then, V1=VB-E1 is obtained, and the voltage V1 becomes lower than the battery voltage VB. Therefore, the voltage supplied to the negative input terminal of the comparator CMP2 is instantly lowered to VB-E1. However, the voltage V3 of the point P3 cannot be instantly lowered because of the time constant circuit configured by the resistors R4, R5 and the capacitor C1. During this period, therefore, the voltage V1 and the voltage V3 are reversed to attain V3>V1, and hence the output signal of the comparator CMP2 is inverted to the H level. The H-level output signal (the counter-electromotive force detection signal) is output to the filter circuit 7.

When the filter circuit 7 is supplied with the counter-electromotive force detection signal from the comparator CMP2, the filter circuit 7 performs a process of shortening the sampling period. Specifically, the filter circuit 7 performs a process of changing the first sampling period to a second sampling period which is shorter than the first sampling period. The process of shortening the sampling period can be easily performed in the filter circuit 7 by, for example, changing the clock pulse signal.

Then, the overcurrent detection signal output from the comparator CMP1 of the voltage detection circuit 4 passes through the filter circuit 7 at the second sampling period, and causes the output signal of the latch DF1 to be inverted for a time period which is shorter than that in the case of the occurrence of a layer short. In the case of the occurrence of a dead short, in this way, the load circuit can be interrupted more quickly than the case of the occurrence of a layer short.

Figure 2B:
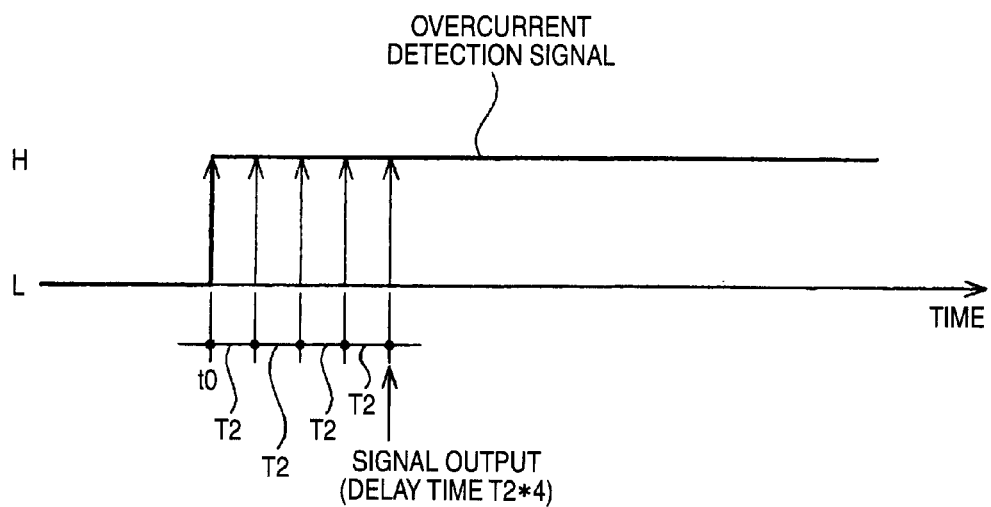

This will be described with reference to the timing chart shown in FIGS. 2A and 2B. FIG. 2A shows the sampling timing in the case where the overcurrent detection signal is sampled at the first sampling period T1, and FIG. 2B shows the sampling timing in the case where the overcurrent detection signal is sampled at the second sampling period T2.

In the case where the overcurrent detection signal is input at time t0 and the filter output signal is output as a result of five samplings, in the case of the first sampling period T1, the delay time is (T1*4) (a first delay time), and, in the case of the second sampling period T2, the delay time is (T2*4) (a second delay time). As apparent from FIGS. 2A and 2B, the delay time in the case where the second sampling period T2 is employed is shorter than that in the case where the first sampling period T1 is employed. In the case of the occurrence of a dead short, namely, the load circuit 10 can be interrupted while the semiconductor switch T11 is turned off more rapidly.

In the overcurrent protection apparatus of the embodiment, with respect to the sampling period of the filter circuit 7 disposed in the subsequent stage of the voltage detection circuit 4, the case of the occurrence of a layer short is different from that of the occurrence of a dead short. In the case of the occurrence of a layer short, specifically, the sampling process is performed at the first sampling period, and, in the case of the occurrence of a dead short, the sampling process is performed at the second sampling period. In the case of the occurrence of a layer short, therefore, the load circuit 100 can be interrupted at the first delay time, and, in the case of the occurrence of a dead short, the load circuit can be interrupted at the second delay time which is shorter than the first delay time.

Therefore, the control for interrupting a load circuit in response to the occurrence of a layer short or the occurrence of a dead short can be surely achieved by the simple configuration. In the case of the occurrence of a layer short, it is not required to urgently interrupt the load circuit 10, and hence the delay time is lengthened to prevent erroneous interruption of the load circuit 10 due to an influence of noises or the like, from occurring. In the case of the occurrence of a dead short, the load circuit 10 is instantly interrupted, whereby the semiconductor switch T11 and the other circuit components can be prevented from the overcurrent in the occurrence of the dead short.

In the case of the occurrence of a dead short, furthermore, only the load circuit in which the dead short occurs can be interrupted, and the other load circuit in which a dead short does not occur can be continued to operate.

This embodiment is described by exemplifying the case where the sampling period of the filter circuit 7 is changed depending on whether a layer short or a dead short occurs. Also when the sampling number is changed in place of the sampling period, the same effects can be obtained.

FIGS. 3A and 3B are timing charts showing examples of the case where the sampling number is changed, FIG. 3A shows a case of a large sampling number, and FIG. 3B shows a case of a small sampling number. As apparent from FIGS. 3A and 3B, as the sampling number is smaller, the delay time is shorter.

Therefore, the delay time can be changed by, in the case of the occurrence of a layer short, for example, setting the sampling number to five as shown in FIG. 3A, and, in the case of the occurrence of a dead short, setting the sampling number to three as shown in FIG. 3B. Specifically, in the case where the sampling number is five as shown in FIG. 3A, the delay time is (T1*4), and, in the case where the sampling number is three as shown in FIG. 3B, the delay time is (T1*2). The delay time in the case where the sampling number is three is shorter than that in the case where the sampling number is five. Also when the apparatus is configured as described above, it is possible to obtain the same effects as those of the above-described embodiment.

Figure 4:
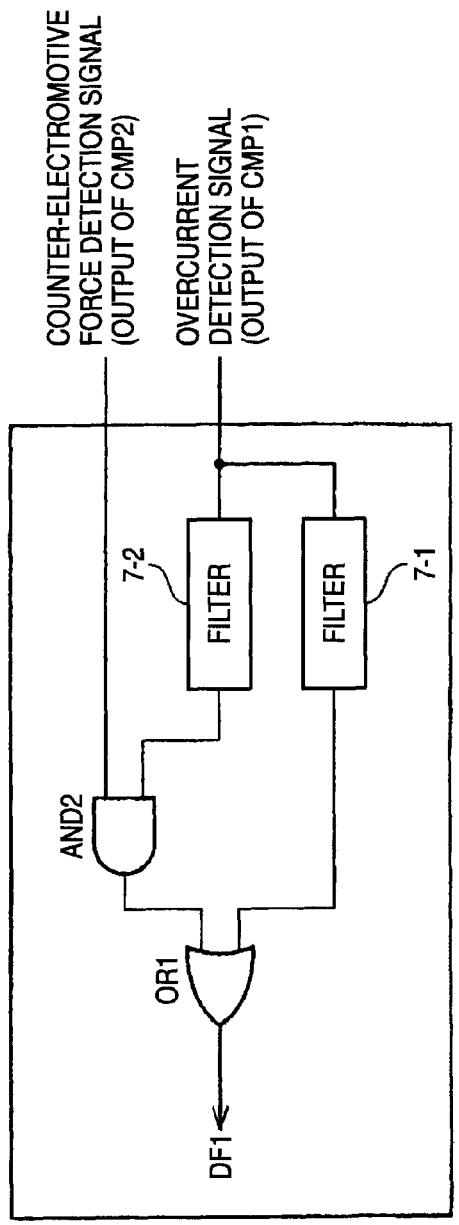
FIG. 4 indicates a block diagram showing the configuration of a control circuit of an overcurrent protection apparatus according to a second embodiment of the invention.
Figure 5:
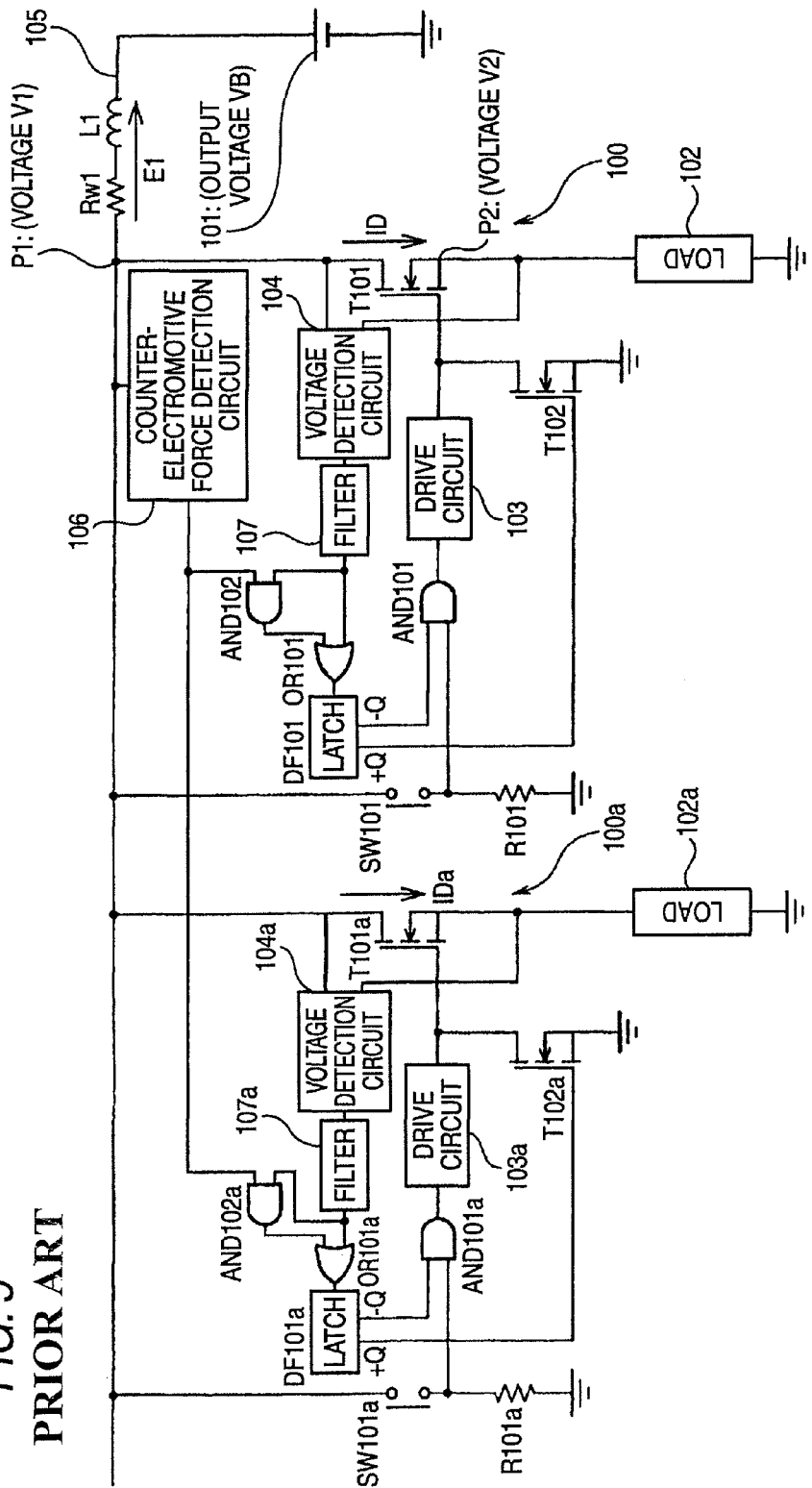
FIG. 5 indicates a circuit diagram showing the configuration of a load drive apparatus on which a conventional overcurrent protection apparatus is mounted.

FIG. 4 is a block diagram showing a control circuit 8' of an overcurrent protection apparatus according to a second embodiment of the invention. As shown in FIG. 4, the control circuit 8' used in the overcurrent protection apparatus of the second embodiment includes two filter circuits 7-1, 7-2. The filter circuit 7-1 outputs a filter output signal (a delay signal) at the first delay time, and the filter circuit 7-2 outputs a filter output signal (a delay signal) at the second delay time which is shorter than the first delay time.

The overcurrent detection signal output from the comparator CMP1 of the voltage detection circuit 4 is supplied to the filter circuits 7-1, 7-2. An output signal of the filter circuit 7-2 is supplied to the one input terminal of the AND circuit AND2, and the counter-electromotive force detection signal is supplied to the other input terminal. Furthermore, the output terminal of the AND circuit AND2, and that of the filter circuit 7-1 are connected to the two input terminals of an OR circuit OR1.

When a layer short occurs, therefore, the counter-electromotive force detection signal is not supplied to the AND circuit AND2, and the output signal of the AND circuit AND2 becomes L. Only the output signal of the filter circuit 7-1 is supplied to the OR circuit OR1. Therefore, the latch DF1 inverts the outputs +Q, –Q at a delay time which depends on the filter circuit 7-1.

By contrast, in the case where a dead short occurs, the counter-electromotive force detection circuit 6 outputs the counter-electromotive force detection signal. Therefore, the output of the AND circuit AND1 becomes the H level, and the latch DF1 inverts the outputs +Q, –Q at a delay time which depends on the filter circuit 7-2. In the same manner as the above-described embodiment, in the case of the occurrence of a layer short, consequently, the load circuit 10 can be interrupted at the first delay time, and, in the case of the occurrence of a dead short, the load circuit 10 can be interrupted at the second delay time which is shorter than the first delay time.

The filter circuits 7-1, 7-2 may be set so that the delay times of the filter circuits 7-1, 7-2 are made different from each other by changing the sampling periods as shown in FIGS. 2A and 2B, or so that the delay times of the filter circuits 7-1, 7-2 are made different from each other by changing the sampling numbers as shown in FIGS. 3A and 3B.

Although the overcurrent protection apparatus of the invention has been described with reference to the illustrated embodiments, the invention is not restricted to them, and the configurations of the components can be replaced with arbitrary configurations having the same functions.

In the above-described embodiments, for example, the example having the load circuits 10, 10a of two systems has been described. The invention is not restricted to this, and may be applied also to the case where circuits of three or more systems are disposed.

INDUSTRIAL APPLICABILITY

The invention is very useful in distinguishing a dead shot and a layer short from each other, and interrupting an adequate load circuit in accordance with the respective situation.

The invention claimed is:

1. An overcurrent protection apparatus which is configured so that a plurality of load circuits each configured by a series connection of a semiconductor switch and a load are connected in parallel, and an electric power is supplied to the load circuits through a common power supply wiring, the overcurrent protection apparatus comprising:
    a first overcurrent detecting section that detects an overcurrent flowing through a power supply line on the basis of a degree of a counter electromotive force generated in the power supply wiring;
    a second overcurrent detecting section that is disposed in each of the load circuits and detects an overcurrent on the basis of a level of a current flowing through each of the load circuits;
    a delaying section that outputs a delay signal at a first delay time when the overcurrent is detected by only the second overcurrent detecting section, and outputs the delay signal at a second delay time which is shorter than the first delay time when the overcurrents are detected by both of the first overcurrent detecting section and the second overcurrent detecting section, wherein the delaying section comprises:
        a first filter circuit that outputs a filter output delay signal at the first delay time, and
        a second filter circuit outputs a filter output delay signal at the second delay time; and
    a controlling section that interrupts only the load circuit from which the overcurrent is detected by the second overcurrent detecting section in the plurality of load circuits.

2. The overcurrent protection apparatus according to claim 1, wherein the second overcurrent detecting section detects a level of a voltage produced across both ends of theemiconductor switch by a current flowed through the semiconductor switch.

3. The overcurrent protection apparatus according to claim 1, wherein the first and second filter circuits of the delay section samples a signal from the second overcurrent detecting section at a predetermined sampling period to output the delay signal; and
    wherein when the overcurrent is not detected by the first overcurrent detecting section, the first filter circuit performs the sampling at a first sampling period, and when the overcurrent is detected by the first overcurrent detecting section, the second filter circuit performs the sampling at a second sampling period which is shorter than the first sampling period.

4. The overcurrent protection apparatus according to claim 1, wherein the first and second filter circuits of the delay section samples a signal from the second overcurrent detecting section at a predetermined sampling period to output the delay signal; and wherein when the overcurrent is not detected by the first overcurrent detecting section, the first filter circuit sets a sampling number in outputting the delay signal, as a first sampling number, and when the overcurrent is detected by the first overcurrent detecting section, the second filter circuit sets the sampling number in outputting the delay signal, as a second number which is smaller than the first sampling number.

5. The overcurrent protection apparatus according to claim 1, wherein the delaying section includes a first delay circuit having the first delay time, and a second delay circuit having the second delay time which is shorter than the first delay time; and wherein the delaying section outputs the delay signal by using the first delay circuit when the overcurrent is detected by only the second overcurrent detecting section, and outputs the delay signal by using the second delay circuit when the overcurrents are detected by both of the first overcurrent detecting section and the second overcurrent detecting section.

* * * * *